United States Patent
Matthey et al.

(10) Patent No.: US 10,095,192 B2
(45) Date of Patent: Oct. 9, 2018

(54) PORTABLE TOUCH ELECTRONIC OBJECT

(71) Applicant: Montres Rado S.A., Lengnau (CH)

(72) Inventors: Gerald Matthey, Ballaigues (CH); Francois Klopfenstein, Delemont (CH); Sergio Rota, Colombier (CH)

(73) Assignee: Montres Rado S.A., Lengnau (CH)

(*) Notice: Subject to any disclaimer, the term of this patent is extended or adjusted under 35 U.S.C. 154(b) by 8 days.

(21) Appl. No.: 14/442,922

(22) PCT Filed: Nov. 26, 2013

(86) PCT No.: PCT/EP2013/074752
§ 371 (c)(1),
(2) Date: May 14, 2015

(87) PCT Pub. No.: WO2014/083001
PCT Pub. Date: Jun. 5, 2014

(65) Prior Publication Data
US 2015/0301507 A1    Oct. 22, 2015

(30) Foreign Application Priority Data

Nov. 28, 2012 (EP) .................................. 12194651
Mar. 27, 2013 (EP) .................................. 13161359

(51) Int. Cl.
*G04G 21/08*    (2010.01)
*G04G 17/06*    (2006.01)
(Continued)

(52) U.S. Cl.
CPC ............. *G04G 21/08* (2013.01); *G04G 17/06* (2013.01); *G06F 1/163* (2013.01); *G06F 1/1643* (2013.01);
(Continued)

(58) Field of Classification Search
CPC .......... G06F 1/163; G06F 1/16; G06F 1/1662; G06F 1/1643; G04G 21/08; G04G 21/00;
(Continued)

(56) References Cited

U.S. PATENT DOCUMENTS 4,468,131 A    8/1984  Bui et al.
6,960,735 B2 * 11/2005 Hein ....................... B29C 45/16
                                                         200/600
(Continued)

FOREIGN PATENT DOCUMENTS

EP    1 610 209 A1    12/2005
JP    2001-100907 A    4/2001
(Continued)

OTHER PUBLICATIONS

LCD—dictionary.com—Oct. 13, 2016.*
(Continued)

*Primary Examiner* — Sean Kayes
(74) *Attorney, Agent, or Firm* — Oblon, McClelland, Maier & Neustadt, L.L.P.

(57) ABSTRACT

A portable electronic object including a case including at least a first part made of insulating materials, at least one electronic module providing at least one piece of information to a display, and a controller allowing a user to act on the at least one electronic module.

25 Claims, 4 Drawing Sheets

(51) Int. Cl.
*G06F 1/16* (2006.01)
*G06F 3/0482* (2013.01)
*H03K 17/96* (2006.01)
*G06F 3/041* (2006.01)

(52) U.S. Cl.
CPC .......... *G06F 1/1662* (2013.01); *G06F 3/0412* (2013.01); *G06F 3/0482* (2013.01); *H03K 17/962* (2013.01); *H03K 2017/9602* (2013.01); *H03K 2217/960755* (2013.01)

(58) Field of Classification Search
CPC ................ G04G 17/06; H03K 17/962; H03K 2017/9602; H03K 2217/960755
See application file for complete search history.

(56) References Cited

U.S. PATENT DOCUMENTS

| | | | | |
|---|---|---|---|---|
| 7,791,587 | B2* | 9/2010 | Kosugi | G04G 21/08 345/156 |
| 8,294,055 | B2* | 10/2012 | Kim | B29C 45/14811 200/333 |
| 8,641,306 | B2* | 2/2014 | Schaffer | G06F 1/163 368/10 |
| 2006/0170649 | A1 | 8/2006 | Kosugi et al. | |
| 2009/0073130 | A1* | 3/2009 | Weber | G06F 3/03547 345/173 |
| 2009/0323262 | A1 | 12/2009 | Arita | |
| 2010/0187074 | A1* | 7/2010 | Manni | G04C 3/004 200/4 |
| 2011/0211355 | A1* | 9/2011 | Hakemeyer | G04C 23/46 362/382 |
| 2013/0002133 | A1* | 1/2013 | Jin | G09F 9/33 313/511 |

FOREIGN PATENT DOCUMENTS

JP 2007-142577 A 6/2007
JP 2010-35020 A 2/2010

OTHER PUBLICATIONS

How it works: The technology of touch screens—computerworld.com—Oct. 2012.*
Technology of Touchscreens—computerworld.com/article/2491831/computer-hardware/computer-hardware-how-it-works-the-technology-of-touch-screens.html?page=2—Oct. 17, 2012.*
International Search Report dated Nov. 5, 2014, in PCT/EP2013/074752, filed Nov. 26, 2013.

* cited by examiner

PORTABLE TOUCH ELECTRONIC OBJECT

CROSS-REFERENCE TO RELATED APPLICATIONS

This is a National Phase Application in the United States of International Patent application PCT/EP2013/074752 filed Nov. 26, 2013 which claims priority on European patent application No. 12194651.1 filed Nov. 28, 2012. The entire disclosures of the above patent applications are hereby incorporated by reference.

The invention concerns a portable electronic object including a case, said case including a first part made of ceramic materials, said portable electronic object including at least one electronic module providing at least one piece of information to display means arranged underneath the glass, said portable electronic object further including control means enabling a user to act on said at least one electronic timepiece module.

BACKGROUND OF THE INVENTION

A portable electronic object, such as an electronic device or, for example, a portable timepiece includes a case generally formed of a middle part closed by a back cover and by a glass. Inside the case is arranged a timepiece movement, which may be totally mechanical or electronic. This timepiece movement is arranged to provide time information, said time information being displayed via analogue or digital display means. The timepiece further includes control means enabling the user to interact with said timepiece.

In general, the control means take the form of push buttons or a crown acting mechanically on said timepiece movement. These push buttons and crowns may be supplemented by a touch interface. This touch interface is used to improve the interactivity of the timepiece and simplify handling especially when the timepiece proposes a significant number of menus and functions. This touch interface may also contribute to the improvement of the aesthetic appearance of the product by removing the usual external protrusions of a crown or push-buttons.

The touch interface may be a resistive touch interface or a capacitive touch interface. For the case of a capacitive touch interface, this may take the form of an electrode placed on the lower face of the glass, the glass being an electrically non-conductive element. The electrode is subjected to an electric field. When the user wishes to activate the interface, he exerts a contacts the external face of the glass, preferably with his finger. This means that the contact can be a tap or a light touch. This contact causes an additional capacitance to appear, formed between said electrode and the finger which is an electrically conductive element. This variation in capacitance is detected by the electronic timepiece movement which will act according to its programming. This touch interface is created on the watch glass and not on the case since the latter is generally made of metal and is therefore electrically conductive. The case does not permit a capacitance to appear.

However, these touch interfaces arranged on the timepiece glass have drawbacks.

A first drawback of arranging the touch interface on the glass is that it does not provide optimum visibility of information. Indeed, the fact of having a touch interface arranged on the timepiece glass means that the user has to regularly place his fingers on the glass. Consequently, the visibility of the information displayed on the dial is regularly hindered by the user's fingers. The user therefore has more difficulty in reading the information provided by the timepiece.

Another drawback is that having a touch interface associated with conventional control elements such as push-buttons or crowns makes the timepiece more complex. Indeed, the fact of having a multitude of buttons in addition to the touch interface results in a larger number of combinations between the buttons and touch interface. The timepiece is therefore more complex to operate.

Another drawback is that for timepieces with a dark dial or a negative contrast display with a dark background, regularly placing fingers on the glass leaves traces (grease, sweat, . . . ) which reduces the attractiveness of the product (like a window covered in fingerprints).

SUMMARY OF THE INVENTION

It is an object of the invention to overcome the drawbacks of the prior art by proposing to provide a portable electronic object which is intuitive and simple to use and has information that can be clearly read in all circumstances.

To this end, the invention concerns a portable electronic object including a case comprising at least a first part made of insulating materials, said portable electronic object including at least one electronic module providing at least one piece of information to display means, said portable electronic object further including control means allowing the user to act on said at least one electronic module, characterized in that said control means include at least touch control means including a least one electrode system arranged in said at least one first part, said at least one electrode system including a support made of insulating materials on which at least one electrode is arranged, said electrode system further including securing means for securing said support to the electronic movement and electrically connecting said at least one electrode to the electronic module.

One advantage of the present invention is that it provides a portable electronic object which combines usability with an intuitive touch interface and good visibility by arranging the touch interface on the case of the portable object. Thus, the user avoids obstructing the display means when he uses the touch interface.

In a first advantageous embodiment, said at least one electrode is a sheet made of electrically conductive materials fixed to said support.

In a second advantageous embodiment, said at least one electrode is formed directly on said support.

In a third advantageous embodiment, the securing means include at least one mounting flange made of conductive materials and secured, on the one hand to the timepiece movement, and on the other hand to the support, permitting electrical conduction between said at least one mounting flange and said at least one electrode.

In a fourth advantageous embodiment, said at least one electrode system includes a plurality of electrodes arranged on the same support.

The invention also concerns a portable electronic object including a case comprising at least a first part made of insulating materials, said portable electronic object including at least one electronic module providing at least one piece of information to display means, said portable electronic object further including control means allowing the user to act on said at least one electronic module, characterized in that said control means include at least touch control means comprising at least one electrode system and arranged in said at least one first part.

In another advantageous embodiment, said at least one electrode system includes at least one structure made of metallic materials forming the electrode and directly electrically connected to the electronic module.

In another advantageous embodiment, said at least one electrode system includes at least one flexible printed circuit forming the electrode and directly electrically connected to the electronic module.

In another advantageous embodiment, said at least one electrode system includes at least one electrode arranged on the inner face of said first part and electrically connected to the electronic module by connecting means.

In another advantageous embodiment, said at least one electrode is a sheet made of electrically conductive materials secured to the inner face of said first part.

In another advantageous embodiment, said at least one electrode is a layer of electrically conductive materials deposited on the inner face of said first part.

In another advantageous embodiment, the case middle is made entirely of insulating materials.

In another advantageous embodiment, the insulating material is a ceramic.

In another advantageous embodiment, the touch means include at least one electrode system in proximity to the inner face of said first part.

In another advantageous embodiment, the touch means include at least one electrode system in contact with the inner face of said first part.

In another advantageous embodiment, the case is formed of a middle part closed by a glass and a back cover.

In another advantageous embodiment, the portable object is a timepiece.

BRIEF DESCRIPTION OF THE DRAWINGS

The objects, advantages and features of the portable electronic device or object according to the present invention will appear more clearly in the following detailed description of at least one embodiment of the invention, given solely by way of non-limiting example and illustrated by the annexed drawings, in which.

DETAILED DESCRIPTION OF THE INVENTION

Figure 1:
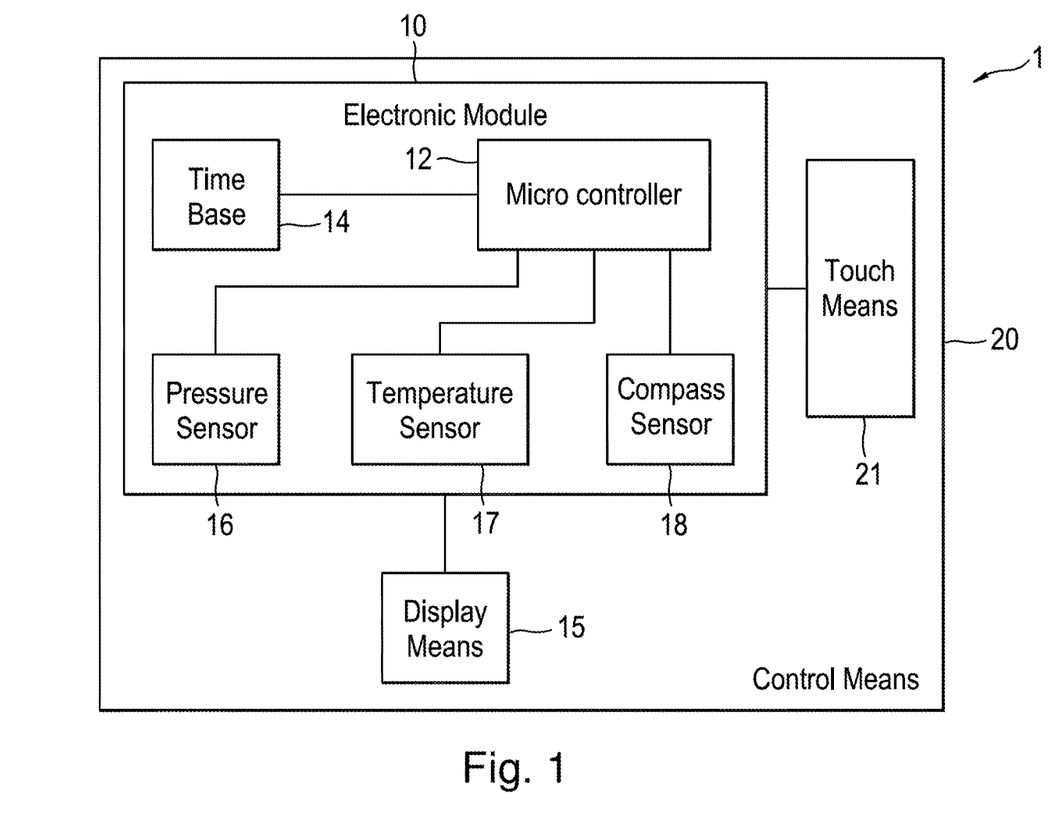
FIG. 1 is a schematic view of a portable electronic apparatus.

FIG. 1 shows a portable electronic apparatus 1 or portable electronic object according to the invention. This portable electronic object may be a mobile telephone or a mobile GPS device or a laptop or a touch tablet, a heart rate monitor for sport or a portable music player or a timepiece 1. In the description below we will take the example of a timepiece, but this example is not restrictive. This timepiece 1, including a case or housing 3 formed by a middle part 5 closed by a back cover 9 and by a glass 7. An electronic module 10 is arranged inside case 3. This electronic module 10 is configured to provide at least one piece of information required to be displayed. Electronic module 10 is for example an electronic timepiece movement 11, which includes at least one microcontroller 12 connected to a time base 14 and is configured to provide at least one piece of time information, such as for example the current time. Microcontroller 12 may also be an application specific integrated circuit (ASIC). This information is sent to display means 15, which may be analogue or digital. Timepiece movement 11 may also include various sensors such as, for example, a pressure sensor 16 for providing altitude or depth or meteorological data. A temperature sensor 17 or a compass sensor 18 may also be provided. Further, it is possible to envisage arranging several electronic modules 10 inside case 3 of timepiece 1, each providing at least one piece of information. In the following description, it will be assumed that only one electronic timepiece movement is arranged inside said case.

Figure 2:
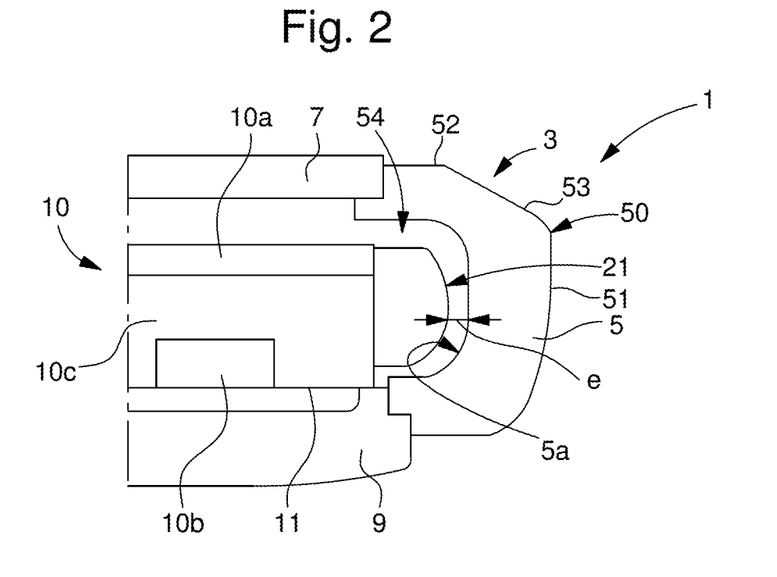
FIG. 2 is a schematic cross-section of the electronic apparatus according to the invention.
Figure 3:
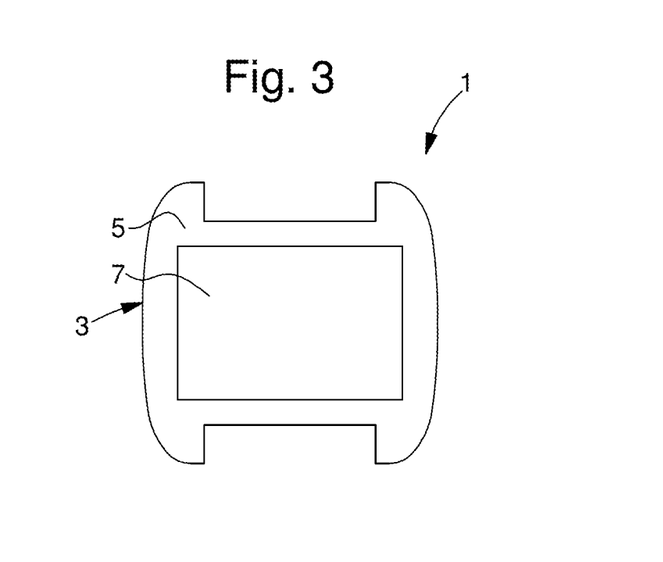
FIG. 3 is a schematic top view of the electronic apparatus according to the invention.

This electronic timepiece movement 11, visible in FIG. 2, includes a main plate 10c containing a recessed housing 10d for an electrical accumulator 10b, such as a battery. This timepiece movement 10 further includes a printed circuit board or PCB 10a to which the various integrated circuits and electrical and electronic components are fixed. Printed circuit board 10a and main plate 10c are arranged so that the various components fixed to said printed circuit board can be powered by battery 10b.

Timepiece 1 further includes control means 20 used to enable the user to interact with said electronic timepiece module 11. This makes it possible for the user to select and activate the various functions.

Advantageously according to the invention, control means 20 include at least touch means 21 arranged on case 3 of timepiece 1. The timepiece could be arranged to include only touch means 21, but it may also include at least one button or crown for controlling certain functions.

Touch means 21 are of the capacitive type. Such a capacitive system uses the principle of an electrode, subjected to an electric field, placed on the lower face of an insulating element. An additional capacitance is formed when the user enters into contact with the other face of an insulating element with his finger varying the total capacitance seen by the system, which permits detection.

Touch means 21 include an electrode system 100 and an insulating element. Advantageously, the present invention provides that case 3 acts as the insulating element. To achieve this, timepiece case 3 includes at least a first part 3a made of an insulating material, preferably a ceramic material. A plastic material, or sapphire, may also be used. This first part 3a made of insulating material thus forms said insulating element necessary for touch means 21. This first part 3a made of insulating material thus has an external face which is the surface on which the user will act, and an internal face on which an electrode system 100 is arranged. For example, case middle 5 is arranged to include first part 3a made of ceramic material.

Figure 10:
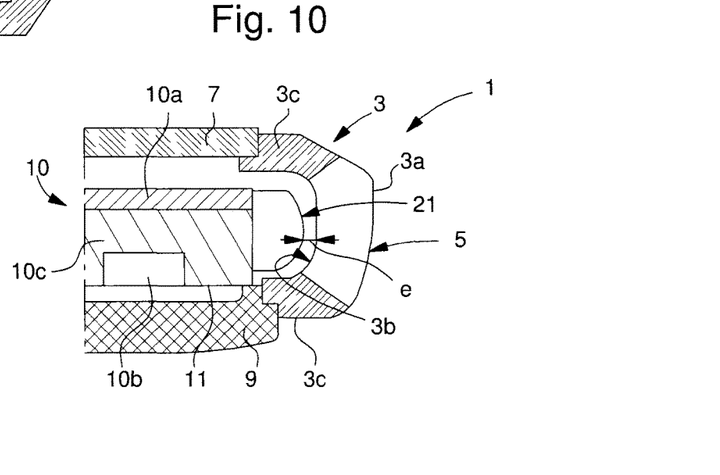
FIG. 10 is a schematic view of a variant cross-section of the electrode system according to the invention.

In an example embodiment of case middle 5 visible in FIG. 10, the case middle may take the form of a metal or plastic frame 3c having an identical shape to the final case middle yet having an orifice in which first ceramic part 3a is inserted. This first ceramic part 3a is integrally secured to the frame by bonding or screws or any other possible securing means. Preferably, the entire case middle 5 is made of ceramic so as to obtain a one-piece case middle or part. Accordingly, a method that is simpler to perform is obtained.

Electrode system 100 includes at least one electrode 101 electrically connected to electronic timepiece movement 11. This electrode system 100 is arranged to be placed in proximity to the inner face 3b of first part 3a made of electrically non-conductive materials. This proximity to inner face 3b of first part 3a made of insulating material means that, when the user's finger enters into contact with the external face of said first part, an additional capacitance is created. This variation in capacitance is detected by electronic timepiece movement 11 which will act according to the programme implemented in said electronic timepiece movement.

For example, touch means 21 are arranged on the case middle in the 9 o'clock and/or 3 o'clock areas. It is thus understood that for a square case and case middle, touch means 21 are arranged on the area or areas of the case middle parallel to the 12 o'clock-6 o'clock axis. For a case and case middle of circular shape, touch means 21 are arranged on the 2 o'clock-4 o'clock and 8 o'clock-10 o'clock area or areas, that is to say the areas between two symmetrically opposite horns. The fact that touch means 21 are arranged on the case middle in the 9 o'clock and 3 o'clock areas provides flexibility of use so that it is possible to only activate touch means 21 in the 9 o'clock area if the user wears the timepiece on his right wrist or to only activate touch means 21 in the 3 o'clock area if the user wears the timepiece on his left wrist. This selective activation of touch means 21 arranged on the case middle in the 9 o'clock and 3 o'clock areas may be automatic or manual.

Of course, the touch means may be arranged anywhere on case middle 5.

In a preferred embodiment of the invention, case middle 5, made entirely of ceramic materials and visible in the cross-section of FIG. 2, has a specific geometry. This specific geometry is configured so that the case middle is provided with sides 50 having a first portion 51 extending perpendicularly to back cover 9 of said case 3, a second portion 52 extending parallel to glass 7 and arranged in the same plane as said glass 7, and an inclined third portion 53 connecting first portion 51 and second portion 52. This configuration makes it possible, in a top view, to obtain surfaces used for the touch keys of a size allowing the user's fingers not to slip. The inner wall 5a of case middle 5, similar to inner face 3b of first part 3a, has a hollow portion 54 so that electrode system 100 can be housed therein. It will be understood that case middle 5 may simply include two portions perpendicular to each other.

Figure 4:
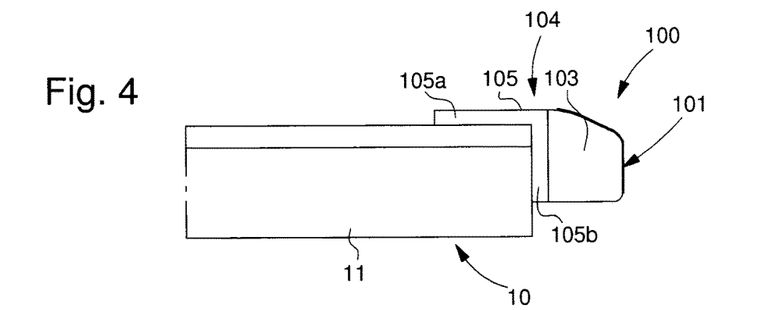
FIG. 4 is a schematic cross-section of the movement of the electronic apparatus according to the invention.
Figure 5:
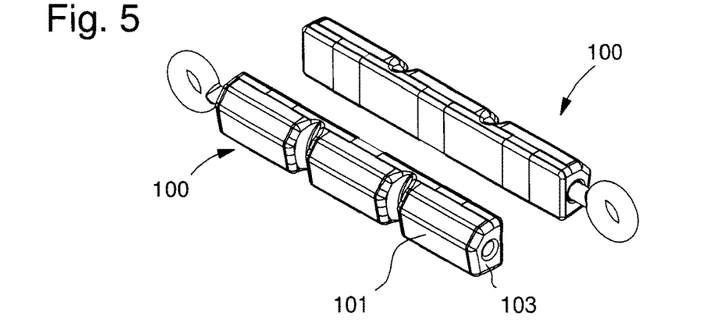
FIG. 5 is a schematic view of a first solution for the electrode system according to the invention.

The electrode system 100 of this preferred embodiment includes at least one electrode 101 arranged on a support 103. FIG. 4 shows only electronic module 10 and the electrode system without case middle 5. Support 103 takes the form of a part made of insulating materials such as, for example, plastic, wood or ceramic. At least one electrode 101 is arranged on this support 103. This electrode 101 is made of an electrically conductive material like a metal such as copper or gold. This electrode 101 may be formed of a metallic sheet fixed to support 103 by brazing, mechanical fastening or bonding with a conductive or non-conductive adhesive. A conductive adhesive is charged with particles, such as silver particles ensuring electrical conductivity. It is also possible for electrode 101 to be made directly on support 103. For example the use of a galvanic growth, electroforming or electroplating technique makes it possible to deposit a fine layer of electrically conductive material.

In the present case, support 103 has a substantially similar profile to that of hollow portion 54 arranged on inner wall 5a of case middle 5. Here, support 103 has a profile formed of two perpendicular straight lines with a truncated top portion forming an inclined plane, i.e. a similar profile to sides 50 of case middle 5. Of course, hollow portion 54 of case middle 5 and the profile of support 103 may have the most diverse shapes. Of course, support 103 and/or electrode 101 may have a similar shape to that of case middle 5.

Figure 6:
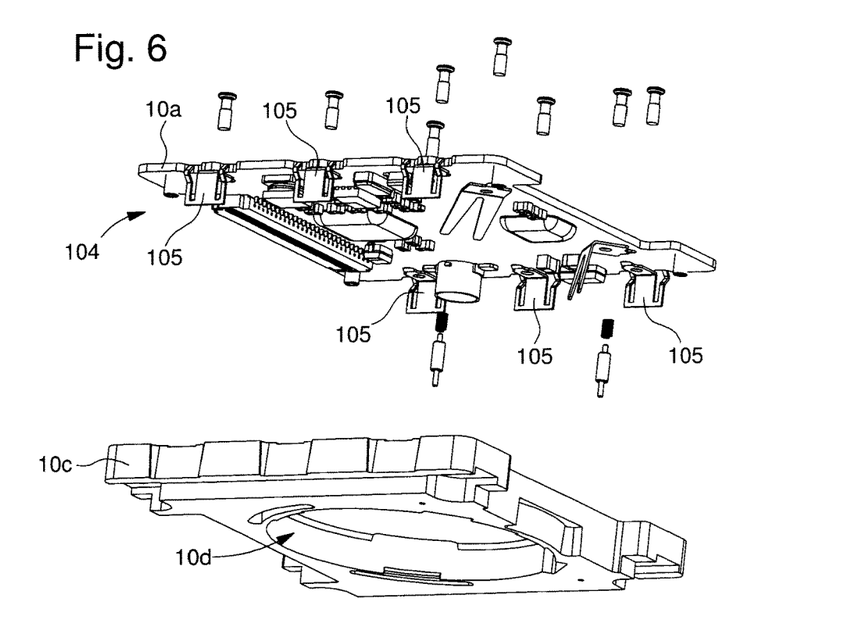
FIG. 6 is a schematic exploded view of the electronic module of the timepiece according to the invention.

Electronic timepiece movement 11 also includes securing means 104 on which support 103 is secured as seen in FIG. 6. Securing means 104 may be mounting flanges 105, which take the form of metallic elements fixed to main plate 10c or to said printed circuit board. Said mounting flanges 105 are arranged to be electrically connected to printed circuit board 10a. For example, these mounting flanges 105 take the form of plates curved at right angles so as to form two branches. A first branch 105a is secured to printed circuit board 10a and electrically connected to the various circuits, preferably to be clamped by main plate 10c and said printed circuit board 10a. The second branch 105b is pressed against a lateral wall of main plate 10b once said main plate and printed circuit board have been assembled. This thus enables support 103 carrying at least one electrode 101 to be secured on said mounting flange 105. It is then possible to envisage that the integrated circuit(s) which must be electrically connected to electrode 101 are connected via a wire or a braze or a conductive adhesive. Advantageously, mounting flange 105 is arranged to electrically connect the electrode and the printed circuit board.

In a variant of this solution visible in FIG. 6, support 103 may be devised to carry several electrodes 101. Support 103 extends accordingly over a longer length so that electrodes 101 can be placed one beside the other. To secure such a support, several mounting flanges 105 are used to ensure good attachment. Preferably, a number of mounting flanges 105 equal to the number of electrodes 101 will be used so that each electrode 101 is electrically connected to printed circuit board 10c by one mounting flange 105.

When electronic timepiece movement 11 and support 103 provided with electrodes 101 and securing means 104 are inserted inside case 3, it is possible to envisage that electrodes 101 can be in contact with inner wall 5a of case middle 5 or, conversely, that a space (e) is present between electrodes 101 and said inner wall 5a, as seen in FIG. 2. Since ambient air is naturally a dielectric, the presence of this space (e) is not necessarily inconvenient. Space (e) simply causes a change in the intrinsic capacitance of the device. It is therefore possible to envisage that the intrinsic capacitance and consequently the sensitivity of touch means 21 can be adjusted by moving electrode 101 closer to or further from inner face 3b of case middle 5.

It may be advantageously provided that the presence of this space (e) is desired. Indeed, such a space (e) may be used to facilitate the mounting of electronic timepiece module 11. The latter is assembled prior to be mounted which means that electrode system 100 is secured to timepiece movement 11 before the movement is inserted inside case 3. The excess space can allow the position of timepiece movement 11 to be adjusted.

The space between electrode system 100 and case middle 5 may be filled, once timepiece movement 10 is secured inside the case. This space (e) may be filled with an insulating material such as plastic resin or selectively for each electrode with a conductive material such as conductive adhesive, while avoiding connecting the various electrodes to each other at the risk of a short circuit. This conductive adhesive may improve electrical conductivity.

Of course, it is possible to envisage that electrode system 100 can take a different form.

In another solution, it is possible to envisage that the actual mounting flanges 105 serve as electrodes. Indeed, mounting flanges 105 are made of electrically conductive materials to permit the electrical connection between electrode 101 and printed circuit board 10a. For this effect to occur, it is necessary for mounting flanges 105 to be close to inner face 3b of first part 3a. This solution makes it possible to obtain electrodes formed by metallic structures that are directly secured and directly connected to printed circuit board 10a.

Figure 7:
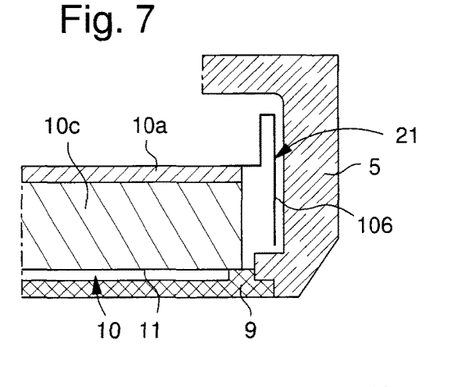
FIGS. 7 to 9 show schematic views of three solutions for the electrode system according to the invention.
Figure 8:
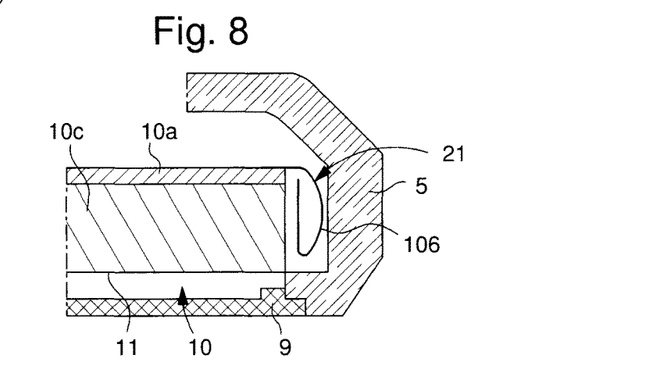
Figure 9:
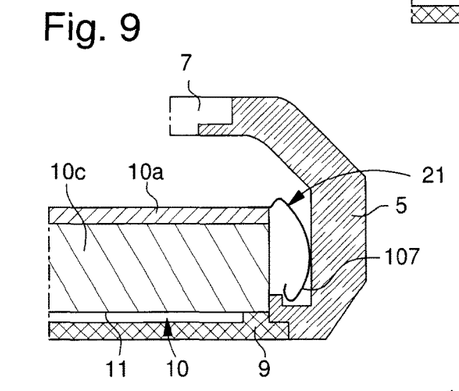

In a variant visible in FIGS. 7 and 8, the metallic structures are not mounting flanges 105 but metallic structures 106 exclusively made to form electrodes. The shape of these metallic structures is devised to form the most efficient possible electrodes 101. For example, if the inner face of the first part made of insulating material is flat, the metallic structures may take the form of a T-shaped structure. The central branch is the branch secured to the printed circuit board, whereas the branch perpendicular to the central branch is that which forms the electrode opposite which the finger will be placed. In another example, if the inner face of the first part is curved, it may be envisaged that the metallic structure includes a first flat branch parallel to the plane of the printed circuit board. At the free end of this first parallel branch, a second flat branch extends. This second branch extends perpendicularly to the first branch. This branch may extend to form a T-shaped structure or simply extend to form a similar structure to the mounting flanges described above. At one end of this second branch extends a third curved branch. This third curved branch extends to form a convex surface. In the case of a first branch and a second branch forming a T-shaped structure, the third curved part extends between the two ends. The shape of the electrodes can then be adapted to the shape of the case middle and more specifically to the shape of the first part.

In a third solution, electrodes 101 are flexible circuits 107. Indeed, flexible circuits 107 are formed of a substrate made of a flexible material on which electrical paths are made. These flexible printed circuits 107 then have the advantage of being able to be adapted to fit the complex shapes of the cases in which they are arranged. The flexible circuits are secured by one end to the printed circuit board, the other end being left free. This free end may thus be bent so that said flexible printed circuit can marry the shape of the inner face of the first part. Preferably, the conductive paths of the flexible printed circuit are in contact with the inner face of the first part.

In another variant, each electrode of electrode system 100 takes the form of a disc made of electrically conductive material. This disc of electrically conductive material is arranged on the inner face of the first part of the case middle. This disc may be formed of a layer of electrically conductive material or a layer of conductive paint deposited on the inner face of the first part of the case middle or a sheet of electrically conductive material secured or bonded on the inner face of the first part of the case middle. The electrode system also includes connecting means for electrically connecting each electrode disc 101 to printed circuit board 10c of the timepiece movement. These connecting means may, depending on the configuration of the timepiece, take various forms. For example, these connecting means may be an electrical wire or a flexible printed circuit or conductive adhesive or even a mounting flange.

The advantage of such a variant is the perfect positioning of the electrodes with respect to the first part of the case middle. Indeed, by making electrodes 101 directly on the inner face of the first part of the case middle, it is certain that said electrodes will be properly positioned. Hence, even if the timepiece movement were to have a position offset from its optimum position, the electrodes would not be offset. The connecting means, such as electric wires or flexible printed circuits are then arranged to compensate for this offset.

It will be clear that various alterations and/or improvements and/or combinations evident to those skilled in the art may be made to the various embodiments of the invention set out above without departing from the scope of the invention defined by the annexed claims.

It will be clear that touch means 21 arranged according to the present invention are used for manipulation of the various timepiece functions such as, for example, the setting of the current time, of a date or the setting of an alarm time. To achieve this, it may be provided that the touch means, arranged in the 3 o'clock and 9 o'clock area of the case middle are provided with at least two electrodes or at least two touch keys. In a particular case, the case middle is provided with three electrodes or three touch keys. In this particular case, for example of setting the current time, it is possible to envisage that a first electrode is used for activating the function, whereas the second and third electrodes are used for incrementing or decrementing the current time. The first electrode is also used for confirming the current time setting.

Further, it will be understood that, for a portable object 1 other than a timepiece, said portable electronic object will only include a case 3 provided with at least a first part 3a made of insulating materials. The portable electronic object includes at least one electronic module 10 providing at least one piece of information to display means 15, which may be, for example, an LCD screen integrated in the case.

The invention claimed is:

1. A portable electronic object, comprising:
a case comprising at least one first part including at least one insulating material, the at least one first part includes a case middle comprising a front face, a back face, and side surfaces, the side surfaces comprising a first side surface portion extending in a direction perpendicular to a plane of the back face, a second side surface portion extending in a direction parallel to a plane of the front face, and at least one inclined side surface portion connecting the first side surface portion and the second side surface portion and extending in a direction that intersects both the plane of the front face and the plane of the back face;
at least one electronic module configured to provide at least one piece of information to a display; and
a controller configured to allow a user to act on the at least one electronic module,
wherein the controller includes at least a touch controller including at least one electrode system disposed in the at least one first part, the at least one electrode system including a support including the at least one insulating material on which at least one electrode system is disposed, the at least one electrode system further including a structure to secure the support to the at least one electronic module and to electrically connect the at least one electrode system to the at least one electronic module, and the at least one electrode system projects outward from an outer peripheral side surface of the electronic module so that the at least one electrode system is suspended above a bottom of an inner face of the case middle, and wherein the side surfaces extend uninterrupted from the front face to the back face around a periphery of the object, maintain an air gap between the side surfaces and the touch controller, and prevent physical contact with the touch controller.

2. The portable electronic object according to claim 1, wherein the at least one electrode system is a sheet of electrically conductive material secured on the support.

3. The portable electronic electrode according to claim 2, wherein the structure to secure the support includes at least one mounting flange of at least one conductive material secured to the at least one electronic module and to the support, permitting electrical conduction between the at least one electronic module and the at least one electrode system.

4. The portable electronic object according to claim 1, wherein the at least one electrode system is disposed directly on the support.

5. The portable electronic electrode according to claim 4, wherein the structure to secure the support includes at least one mounting flange of at least one conductive material secured to the at least one electronic module and to the support, permitting electrical conduction between the at least one electronic module and the at least one electrode system.

6. The portable electronic electrode according to claim 1, wherein the structure to secure the support includes at least one mounting flange of at least one conductive material secured to the at least one electronic module and to the support, permitting electrical conduction between the at least one electronic module and the at least one electrode system.

7. The portable electronic module according to claim 1, wherein the at least one electrode system includes a plurality of electrodes disposed on the support.

8. The portable electronic object according to claim 1, wherein the case is made entirely of the at least one insulating material.

9. The portable electronic object according to claim 1, wherein the at least one insulating material is a ceramic.

10. The portable electronic object according to claim 1, wherein the at least one electrode system is disposed in proximity to an inner face of the first part.

11. The portable electronic object according to claim 1, wherein the at least one electrode system contacts an inner face of the at least one first part.

12. The portable electronic object according to claim 1, wherein the case middle is closed by a glass and a back cover.

13. The portable electronic object according to claim 1, wherein the portable electronic object is a timepiece.

14. A portable electronic object, comprising:
a case comprising at least one first part including at least one insulating material, the at least one first part includes a case middle comprising a front face, a back face, and side surfaces, the side surfaces comprising a first side surface portion extending in a direction perpendicular to a plane of the back face, a second side surface portion extending in a direction parallel to a plane of the front face, and at least one inclined side surface portion connecting the first side surface portion and the second side surface portion and extending in a direction that intersects both the plane of the front face and the plane of the back face;
at least one electronic module configured to provide at least one piece of information to a display;
a controller configured to allow a user to act on the at least one electronic module,
wherein the controller includes at least a touch controller including at least one electrode system disposed in the at least one first part, and the at least one electrode system projects outward from an outer peripheral side surface of the electronic module so that the at least one electrode system is suspended above a bottom of an inner face of the case middle, and
wherein the side surfaces extend uninterrupted from the front face to the back face around a periphery of the object, maintain an air gap between the side surfaces and the touch controller, and prevent physical contact with the touch controller.

15. The portable electronic object according to claim 14, wherein the at least one electrode system includes at least one structure of metallic materials forming an electrode and directly electrically connected to the at least one electronic module.

16. The portable electronic object according to claim 14, wherein the at least one electrode system includes at least one flexible printed circuit forming an electrode and directly electrically connected to the at least one electronic module.

17. The portable electronic object according to claim 14, wherein the at least one electrode system includes at least one electrode disposed on an inner face of the at least one first part and electrically connected to the at least one electronic module by a connector.

18. The portable electronic object according to claim 17, wherein the at least one electrode system is a sheet of electrically conductive materials secured to the inner face of the at least one first part.

19. The portable electronic object according to claim 17, wherein the at least one electrode system is a layer of electrically conductive materials deposited on the inner face of the at least one first part.

20. The portable electronic object according to claim 14, wherein the case is made entirely of the at least one insulating material.

21. The portable electronic object according to claim 14, wherein the at least one insulating material is a ceramic.

22. The portable electronic object according to claim 14, wherein the at least one electrode system is disposed in proximity to an inner face of the at least one first part.

23. The portable electronic object according to claim 14, wherein the at least one electrode system contacts an inner face of the at least one first part.

24. The portable electronic object according to claim 14, wherein the case further comprises a case middle closed by a glass and a back cover.

25. The portable electronic object according to claim 14, wherein the portable electronic object is a timepiece.

* * * * *

UNITED STATES PATENT AND TRADEMARK OFFICE
CERTIFICATE OF CORRECTION

| | |
|---|---|
| PATENT NO. | : 10,095,192 B2 |
| APPLICATION NO. | : 14/442922 |
| DATED | : October 9, 2018 |
| INVENTOR(S) | : Gerald Matthey et al. |

Page 1 of 1

It is certified that error appears in the above-identified patent and that said Letters Patent is hereby corrected as shown below:

In the Claims

Column 9, Line 12 "portable electronic electrode" should read --portable electronic object--, Column 9, Line 22 "portable electronic electrode" should read --portable electronic object--, Column 9, Line 29 "portable electronic electrode" should read --portable electronic object--, Column 9, Line 36 "portable electronic module" should read --portable electronic object--.

Signed and Sealed this
Seventh Day of July, 2020

Andrei Iancu
*Director of the United States Patent and Trademark Office*